United States Patent [19]

Guha et al.

[11] Patent Number: 4,816,082
[45] Date of Patent: Mar. 28, 1989

[54] THIN FILM SOLAR CELL INCLUDING A SPATIALLY MODULATED INTRINSIC LAYER

[75] Inventors: Subhendu Guha; Chi-Chung Yang, both of Troy; Stanford R. Ovshinsky, Bloomfield Hills, all of Mich.

[73] Assignee: Energy Conversion Devices, Inc., Troy, Mich.

[21] Appl. No.: 87,264

[22] Filed: Aug. 19, 1987

[51] Int. Cl.$^4$ ............................................. H01L 31/06
[52] U.S. Cl. .................................. 136/249; 136/255; 136/258; 357/30
[58] Field of Search .......... 136/246, 249 TJ, 258 AM, 136/259; 357/30 F, 30 J, 30 K, 30 L, 30 N

[56] References Cited

U.S. PATENT DOCUMENTS 4,542,256  9/1985  Wiedeman ..................... 136/249 TJ

FOREIGN PATENT DOCUMENTS 56-88377  7/1981  Japan ........................... 136/258 AM
58-18975  2/1983  Japan ........................... 136/258 AM
58-25282  2/1983  Japan ........................... 136/258 AM
58-98988  6/1983  Japan ........................... 136/258 AM Primary Examiner—Aaron Weisstuch
Attorney, Agent, or Firm—Marvin S. Siskind; Richard M. Goldman; Kenneth M. Massaroni

[57] ABSTRACT

One or more thin film solar cells in which the intrinsic layer of substantially amorphous semiconductor alloy material thereof includes at least a first band gap portion and a narrower band gap portion. The band gap of the intrinsic layer is spatially graded through a portion of the bulk thickness, said graded portion including a region removed from the intrinsic layer-dopant layer interfaces. The band gap of the intrinsic layer is always less than the band gap of the doped layers. The gradation of the intrinsic layer is effected such that the open circuit voltage and/or the fill factor of the one or plural solar cell structure is enhanced.

45 Claims, 5 Drawing Sheets 4,816,082

THIN FILM SOLAR CELL INCLUDING A SPATIALLY MODULATED INTRINSIC LAYER

GOVERNMENT RIGHTS

This invention was made with Government support under Contract No. ZB-06003-04 awarded by the Department of Energy. The Government has certain rights in this invention.

FIELD OF THE INVENTION

This invention relates generally to solar cells and more particularly to thin film photovoltaic structures formed from either one or a plurality of stacked solar cells electrically and optically interconnected in series. The intrinsic layer of at least one of said plurality of solar cells is "spatially graded" through a portion of the bulk thereof, which portion is removed from the intrinsic layer-dopant layer interfaces for enhancing the open circuit voltage and/or the fill factor.

BACKGROUND OF THE INVENTION

As will become apparent from the discussion which follows hereinafter, photovoltaic power has not as yet attained the type of commercial acceptance which was predicted at the beginning of the decade. The reason is predominantly economic. The cost of manufacturing, distributing and servicing solar cell installations remains higher than the cost of utilizing grid supplied electrical power. In order for photovoltaically generated power to gain widespread acceptance, it is necessary for costs associated with manufacturing photovoltaic modules, as measured in terms of cost per peak watt of photogenerated power, to decrease. Manufacturing costs are dependent upon (1) the methods by which the semiconductor alloy material of the solar cells are fabricated and processed into modular format, as well as (2) the efficiency of those modularized solar cells. The assignee of the instant invention has championed the fabrication of thin film photovoltaic devices from substantially amorphous semiconductor alloy material, vis-a-vis, the more predominantly accepted fabrication of photovoltaic devices from crystalline semiconductor material. In an effort to implement said thin film semiconductor strategy, said assignee developed a high volume, continuous process in which successive layers of amorphous or substantially amorphous semiconductor alloy material could be deposited onto an elongated web in contiguous, but discrete, deposition chambers. More particularly, the layers of semiconductor alloy material thus deposited onto the web in the vacuum envelope of the deposition system could be utilized to fabricate photovoltaic devices such as single or stacked p-i-n solar cells.

It should thus become apparent that the use of such roll-to-roll processing has minimized the cost of manufacturing photovoltaic modules. Further cost reductions must therefore come by either improving the efficiency of downstream module fabrication or by increasing the photoconversion efficiency by which said photovoltaic modules convert incident radiation to electricity. The assignee of the instant invention has recently developed a method of fabricating 1 foot by 4 foot photovoltaic power modules, which modules are characterized by a reduced number of electrical connections so as to require a minimum number of processing steps. These high current, low voltage power modules have, for the first time, provided for the profitable sale of photovoltaically generated electricity at a cost of about four dollars per peak watt. Therefore, the instant inventors believe that a significant effort in reducing the cost per peak watt of photovoltaically generated electricity has been made in module fabrication and additional reductions must be derived from further improvements in the photoconversion efficiency of said modules.

It is to be noted that the assignee of the instant invention has achieved the highest reported thin film solar cell photoconversion efficiency, an efficiency of about thirteen percent. This record was achieved utilizing a photovoltaic structure in which three discrete p-i-n type solar cells were optically and electrically stacked in series, each cell dedicated to the absorption of photons of incident radiation of a particular portion of the solar spectrum. Through this "spectrum splitting" technique, it becomes possible to fabricate the stacked photovoltaic structure with a plurality of relatively thin photogenerative layers so that the built-in electric field provided by the doped layers effectively collect photogenerated charge carriers and thereby minimize recombinative losses due to "Staebler/Wronski" degradation. The manner in which stacked cells operate to minimize recombinative losses will be described in greater detail in a later portion of this Background.

The concept of utilizing multiple stacked cells to enhance photovoltaic device efficiency was described as early as 1955 by E. D. Jackson in U.S. Pat. No. 2,949,498 issued Aug. 16, 1960. The multiple cell structures disclosed therein were limited to the utilization of p-n junctions formed by single crystalline semiconductor devices. Essentially, the stacked cell concept employs different band gap devices to more efficiently collect various portions of the solar spectrum and to increase $V_{oc}$ (open circuit voltage). In the uppermost or light incident cell, a relatively large band gap semiconductor material absorbs only the short, highly energetic wavelength light; while in the subsequent cells, subsequently smaller band gap materials absorb the longer, less energetic wavelengths of light which pass through the first cell. By substantially matching the photogenerated currents from each serially connected cell, the overall open circuit voltage becomes the sum of the open circuit voltage of each cell; while the short circuit current ($J_{sc}$) of each cell remains substantially constant. Such tandem structures are now commercially employed by the assignee of the instant invention in the large area photovoltaic devices referred to hereinabove by utilizing the aforementioned continuous processing techniques for depositing successive thin film layers of amorphous and microcrystalline semiconductor alloy materials.

In the description which follows, it is to be kept in mind that specialized definitions of amorphicity and microcrystallinity are employed. The term "amorphous", as used herein, is defined to include alloys or materials exhibiting long range disorder, although those alloys or materials may exhibit short or intermediate range order or even contain crystalline inclusions. The term "microcrystalline", as used herein, is defined as a unique class of said amorphous materials characterized by a volume fraction of crystalline inclusions, said volume fraction being greater than a threshold value at which the onset of substantial changes in certain key parameters such as electrical conductivity, optical band gap and absorption constant occurs. It is to be specifically noted that pursuant to the foregoing definitions, microcrystalline material falls within the generic class of amorphous materials.

The assignee of the instant invention has also been active in the development of (1) improved semiconductor alloy materials, both wide and more narrow band gap materials, which materials are characterized by a reduced density of defect states (as low as about $10^{16}\text{cm}^{-3}\text{eV}^{-3}$); (2) improved back reflector materials, including dual layer, highly reflective materials (such as silver buffered by a layer of zinc oxide); and (3) improved, wide band gap doped layers of semiconductor alloy material characterized by high conductivity for increasing the built-in electric field of the solar cells in which they are incorporated. All of these developments were essential in order to develop the aforementioned triple stacked photovoltaic device exhibiting the world record 13% photoconversion efficiency. However, as described hereinabove, even that world record efficiency remains insufficient to provide for cost effective competition between photovoltaically generated electricity and electricity derived from more conventional, depletable energy sources.

It was in an effort to further increase the photovoltaic conversion efficiency of solar cells that the development work which led to the improved cell performance occasioned by the instant invention was undertaken. The strategy employed by the instant inventors was to return to basic considerations which impact upon thin film solar cell design, which considerations are currently accepted by researchers in the field and to reexamine the "conventional wisdom" or given truths regarding the operational interactions of the multilayers thereof. Said inventors were particularly interested in examining the physics of operation of the intrinsic layer of semiconductor alloy material of single and tandem solar cells so as to find a means for enhancing the open circuit voltage derived therefrom without sacrificing the efficient collection of photogenerated charge carriers. It should be noted as a base-line reference, that photovoltaic design had heretofore required the presence of a homogeneous thin film layer of amorphous silicon alloy material (for 1.7 eV optical band gap material) or amorphous silicon germanium alloy material (for less than 1.7 eV optical band gap material) sandwiched between layers of p and n-type semiconductor alloy material. Prior to summarizing the inventive concept disclosed herein, it will be helpful to detail the efforts of researchers in the field to improve solar cell efficiency by modifying the homogeneous nature of the intrinsic layer of semiconductor alloy material represented by said "base-line."

In the course of this analysis, the instant inventors revisited the work of others in the field of solar cell fabrication to consider the type of "unusual" intrinsic layer designs which had previously been considered. For instance, a photovoltaic device constructed with a varying band gap in a narrow portion of the intrinsic layer is disclosed in a paper entitled "Achievement of Higher Efficiency Amorphous Silicon-Germanium Solar Cells Using Affinity Gradients" presented by S. Wiedeman and E. A. Fagen at the 17th Annual I.E.E.E. Photovoltaic Conference held May 1-4, 1984 in Kissimmee, Fla. Disclosed therein is a n-i-p-type photovoltaic device formed of an amorphous silicon-germanium alloy in which the composition of the intrinsic layer of semiconductor alloy material was profiled over the first few hundred angstroms from the light incident surface thereof. This band gap variation was accomplished by gradually altering the ratio of silicon to germanium in those few hundred angstroms. The object of such band gap variation was to establish an electrical field of varying strength adjacent the light incident surface of the intrinsic layer of semiconductor alloy material, which field was adapted to decrease if not eliminate charge carrier losses at the interface of the n type and intrinsic layer. Such losses were occasioned by the back diffusion of charge carriers across the n layer and intrinsic layer interface. The authors of the paper claimed that, because of the presence of the electric field, a 29% improvement in the initial photoconversion efficiency of the photovoltaic devices was achieved.

In commonly assigned U.S. Pat. No. 4,547,621 entitled "Stable Photovoltaic Devices And Method of Producing Same" (the disclosure of which is incorporated herein by reference), M. Hack and S. Guha graded the band gap of the intrinsic layer of silicon alloy material of a light incident n-i-p type photovoltaic device such that the wider band gap portion was disposed proximate the light incident surface. The wide band gap portion (a) was formed so as to be less than one half the thickness of the remaining narrower band gap portion and (b) included at least one band gap broadening element not present in the narrower band gap portion. In this manner, the authors attempted to provide for the uniform absorption of photons of short, highly energetic incident radiation throughout at least a substantial portion of the bulk of the intrinsic layer so as to promote the photogeneration of electron-hole pairs throughout said substantial portion of the intrinsic layer and thereby reduce charge carrier recombination therein. In this manner, the authors claimed to improve long term stability.

In commonly assigned U.S. Pat. No. 4,379,943 entitled "Current Enhanced Photovoltaic Device" (the disclosure of which is incorporated herein by reference), C. Yang, A. Madan, S. Ovshinsky and D. Adler disclosed the fabrication of a novel photovoltaic structure in which the intrinsic layer of semiconductor alloy material includes a first intrinsic layer formed of a non-etching (non-fluorinated) precursor gaseous mixture and a second intrinsic layer preferably formed of silicon and fluorine. The thicknesses of the first and second intrinsic layers were adjusted to match the respective potential drops thereof with the first intrinsic layer being relatively thin and the second intrinsic layer being relatively thick. The short circuit current of the photovoltaic device was said to be enhanced because the first and the second intrinsic layers are fabricated with differing band gaps so as to provide a field throughout those layers.

In commonly assigned U.S. Pat. No. 4,471,155 entitled "Narrow Band Gap Photovoltaic Devices With Enhanced Open Circuit Voltage" (the disclosure of which is incorporated herein by reference), R. Mohr and V. Cannella designed a photovoltaic device which provided enhanced open circuit voltage by fabricating the narrow band gap intrinsic semiconductor alloy material thereof so as to include a second intrinsic region having a band gap wider than the band gap of the first intrinsic region. The second band gap region is disposed between the first band gap region and one of the doped layers. This open circuit enhancement structure can also include a third intrinsic region, which region has a wider band gap than the first intrinsic region and is disposed on the side of the first intrinsic region opposite the second intrinsic region. As is explicitly stated in paragraph 3, lines 18-26 of this patent, "One effect of the increased density of defect states in amorphous silicon-germanium alloys is the reduction in open circuit voltage by an amount larger than can be reasonably expected by the reduction in band gap. This reduction in voltage is attributed to increased recombination at the increased defect states, and to interface states introduced by band gap and structural mismatch at the doped region-intrinsic region boundary." (The emphasis was added because the underlined quote inferentially indicates that [as indicated hereinabove] prior to the instant invention, it was commonly accepted that open circuit voltage delivered by a given cell was limited by the band gap of that cell).

The review of thin film solar cell design undertaken by the instant inventors also located patents which disclosed solar cells wherein the intrinsic layers of semiconductor alloy material were graded substantially throughout the bulk thickness thereof. Specifically relevant were two patents of S. Yamazaki; the first being U.S. Pat. No. 4,239,554 entitled "Semiconductor Photoelectric Conversion Device" and the second being U.S. Pat. No. 4,254,429 entitled "Hetero Junction Semiconductor Devices." It is to be noted that the disclosure of the Yamazaki patents ascribe the inventor's motivation in grading the intrinsic layer was to eliminate the notch or spike which can be formed at the heterojunction (defined, for purposes of this description, as the junction between two regions of the intrinsic material characterized by different band gaps), said spike being due to the photoabsorption of holes or electrons moving from one of two adjacent semiconductor regions across the heterojunction and into the other region. It is to be noted, however, that the reason for such gradation in the Yamazaki patents was to provide for charge carrier transport from the wide band gap energy of one of the doped layers to the narrow band gap energy of the oppositely doped layer without interposing a spike which would prevent or at least interfere with charge carrier mobility. Thus, Yamazaki noted that such transport could most easily be effected by a smooth, continuous band gap variation through the intrinsic layer.

Finally, the instant inventors also became aware of a SERI (Solar Energy Research Institute) report tendered by V. Dalal of Spire in which the band gap of the intrinsic layer of an amorphous silicon alloy solar cell was smoothly graded to achieve a higher open circuit voltage. Dalal proceeded to hypothesize that it would be possible to obtain a higher fill factor by implementing a graded structure so as to initiate an increased drift field which promotes electron trasport in the graded regions. However, the disclosed SERI report failed to achieve significant improvements in $V_{oc}$, incorrectly moved the conduction band so as to improve electron transport (although hole transport represents the limiting charge carrier collection factor in amorphous silicon alloy cells) and utilized doped layers, at least one which was characterized by a band gap less than the band gap of the intrinsic layer.

With this analysis of the prior art in intrinsic layer design as a backdrop and once again realizing that a multijunction approach to the development of high efficiency and stable amorphous silicon alloy solar cells will yield the best results, the critical solar cell design considerations for the fabrication of intrinsic layers of single as well as for tandem photovoltaic structures can now be enumerated. In this approach, the intrinsic layer of each discrete cell is relatively thin so that the photogenerated charge carriers have a relatively short distance to travel before reaching the respective electrodes thereof. At the same time, by stacking a plurality of cells in optical and electrical series relation, all of the photons of the incident solar spectrum are absorbed with discrete cells dedicated to the absorption of a particular range of wavelengths. Since the current photogenerated by each cell must be matched, the top cell is made thin and therefore exhibits stability against the degrading effects of light exposure. The lower cells receive progressively less intense illumination and due to the fact that a cell receiving light of less intensity over a longer period of time does not degrade as much as a cell receiving light of greater intensity over a shorter period of time; the lower cells can be made progressively thicker without jeopordizing stability.

The p-type and n-type layers provide the internal electric field across the intrinsic (photogenerative) layer of a solar cell. It is important that the doped layers are characterized by the highest possible conductivity so that there is no rectifying internal junction formed between the p and n layers of contiguous cells. Further, and of equal importance, high conductivity p and n layers increase the built-in electric field across the photogenerative intrinsic layer, thereby increasing the open circuit voltage and fill factor of the cell. It is of substantial importance that the p and n layers be fabricated of wide band semiconductor alloy materials (certainly wider than the band gaps of the intrinsic layers) so as to exhibit little or no optical absorption of photogenerative photons of incident radiation (charge carriers generated in the doped layers will instantaneously recombine).

It is additionally necessary that the narrow band gap semiconductor alloy material be of as high a quality (possess as low a density of defect states) as possible. Of course, as the band gap of the amorphous silicon alloy material is lowered through the addition of tin, or preferably germanium, additional defect states are created. This is due to (1) the preferential attachment of hydrogen atoms to silicon, thereby creating dangling bonds of germanium in the alloy; (2) the tendency of germanium to assume divalent configurations, thereby initiating additional defect states; and (3) the tendency of noncrystalline germanium films to grow in a columnar fashion, thereby degrading film quality. As previously mentioned, the assignee of the instant invention has, through the incorporation of fluorine into the narrow band gap material, effectively lowered the density of defect states and the degree of sub-band gap absorption in the material without changing the slope of the valence band tail as the optical band gap is decreased to a value as low as about 1.25 eV.

SUMMARY OF THE INVENTION

In the Examples which follow hereinafter, the instant inventors have demonstrated the manner in which the intrinsic layers of thin film amorphous silicon alloy solar cells have been specially designed so as to significantly enhance open circuit voltage without deleteriously affecting the collection of photogenerated charge carriers. The solar cell designs disclosed below begin by discarding the conventionally accepted axiom that the maximum open circuit voltage which can be delivered by a single, but multigapped, solar cell is determined by the width of the most narrow portion of the band gap of the intrinsic layer thereof. While the rationale for such a belief is evident, namely that the available voltage is limited to the degree which the quasi Fermi level of the intrinsic layer of semiconductor alloy material splits, upon illumination; the instant set of experiments conclusively prove that no such limitation exist. Rather, it is speculated herein that the amount of open circuit voltage which can be obtained is limited by the degree which the quasi Fermi level of the widest band gap portion of the intrinsic layer of semiconductor alloy material splits. This finding is not only significant because of the immediate improvement in open circuit voltage which has been demonstrated, but also because of the myriad of novel design considerations and novel structures which can be explored. For example, it is known, as mentioned above, that as the band gap of semiconductor alloy material decreases, the quality of that material also deteriorates. However, spectrum splitting photovoltaic structures require the use of narrow band gap silicon germanium alloy material even though charge carrier collection in such material is limited by the increased density of defect states present therein. More specifically stated, a good fill factor requires a long diffusion length, which diffusion length is shortened by the added density of defect states in narrow band gap silicon germanium alloy material. Therefore, researchers found themselves locked in a stalemate in an effort to develop a solar cell characterized by the highest combination of efficiency and stability; in order to collect the maximum number of incident photons, a low band gap material must be used; however, the efficiency of collection decreases with the use of such narrow band ap material.

The invention disclosed herein affords said researchers a method of unblocking that stalemate by making use of novel graded band gap intrinsic layer structures. Such structures may take any one of three basic formats. In the first of these formats, the intrinsic layer is structured so that the widest band gap region of silicon alloy material is disposed at the p-type layer interface and graded therefrom throughout a substantial portion of the bulk to the most narrow band gap region of silicon germanium alloy material adjacent the n-type layer interface. In the second of these formats, the intrinsic layer is structured so that the narrowmost band gap region of silicon germanium alloy material is disposed at the p-type layer interface and graded therefrom throughout a substantial portion of the bulk to the widest band gap region of silicon alloy material adjacent the n-type layer interface. In the last of these formats, the intrinsic layer is structured so that the widest band gap region of silicon alloy material is graded from a maximum at both of the oppositely disposed doped layer interfaces to a minimum band gap region of silicon germanium alloy material internally thereof. In this last format, the rate at which the germanium content of the intrinsic layer is graded does not have to be, and preferably is not the same from the doped layers to the minimum band gap region. Of course, interfacial buffer layers and interfacial recombination-reducing layers would be employed with any of the aforementioned designs so as to provide substantially uniform, substantially defect free junctions between adjacent layers of varying band gap. Finally, dopants may be added so as to move the Fermi level so as to enhance charge carrier movement and collection.

Therefore, the instant invention provides a structure by which the optical band gap of the intrinsic layer of each solar cell of a stacked photovoltaic device is spatially graded throughout the bulk thereof so that (1) the open circuit voltage obtained from the cell is no longer limited by the narrowmost band gap region of the cell, (2) the field is tailored to promote the collection of photogenerated charge carriers, (3) the transition between layers of differing band gap is graded to further enhance charge carrier movement therebetween and (4) the width of the optical band gap relative to the position of the Fermi level can be controllably designed throughout the thickness of the intrinsic layer.

These and other objects and advantages of the instant invention will become apparent from the Detailed Description of The Invention, the Drawings and The Claims which follow.

There is disclosed herein a solar cell which includes at least one intrinsic layer of thin film substantially amorphous semiconductor alloy material. Each of said at least one intrinsic layer is characterized by a portion of the thickness thereof having a first band gap and a portion of the thickness thereof having a second, minimum band gap more narrow than the first. The intrinsic layer is operatively disposed between oppositely doped layers of semiconductor alloy material. The band gap of all portions of the intrinsic layer not contiguous to the intrinsic layer-dopant layer interfaces is less than the band gap of the dopant layers. The improvement comprises the fact that the band gap of the intrinsic layer is spatially graded over a portion of the bulk thickness of said intrinsic layer, said graded portion including a region removed from the intrinsic layer-dopant layer interfaces.

A substantial portion of the bulk of the intrinsic layer is fabricated from either a silicon, silicon carbon, or silicon germanium alloy material. The percentage of the band gap widening or narrowing element, such as germanium, is incorporated into the preferably silicon germanium alloy material of the intrinsic layer so as to vary throughout a substantial portion of the bulk of the intrinsic layer. The percentage of germanium incorporated may be graded either continually or in a step-wise fashion through such substantial portion and is graded from a minimum adjacent each of the interfaces thereof with the doped layers to a maximum interiorly of the bulk thereof. The grading of such germanium percentage incorporated into the bulk is maintained at said maximum for at least 500 angstroms thickness. The intrinsic layer of silicon germanium alloy material further includes a band gap widening region at the interfaces thereof with the doped layers. In the case of where the intrinsic is graded with a silicon germanium alloy material, the band gap reaches a minimum of 1.2 to 1.6 eV, and preferably 1.4 to 1.5 eV, interiorly of the bulk thereof. The light incident doped layer is fabricated as a p-type microcrystalline silicon alloy material and the doped layer opposite said p-type layer is fabricated as an n-type microcrystalline silicon alloy material. These layers of microcrystalline silicon alloy material are preferably fabricated to further include a band gap widening element selected from the group consisting essentially of carbon, nitrogen and combinations thereof.

The graded incorporation of germanium into said intrinsic layer is more rapid from the intrinsic layer interface with the light incident doped layer to the region of maximum germanium incorporation interiorly of the bulk thereof as compared to the graded incorporation of germanium from the intrinsic layer interface with the oppositely doped layer to said region of maximum germanium incorporation. Boron may be incorporated into the silicon germanium alloy material of said intrinsic layer so as to improve the collection of photogenerated charge carriers. The boron incorporated into said intrinsic layer is preferably graded to compensate for the graded incorporation of germanium thereinto. The intrinsic layer may further include a band gap widening element incorporated into the adjacent interfaces thereof with said doped layers. The band gap widening element is preferably selected from the group consisting essentially of hydrogen, carbon, nitrogen, and mixtures thereof. The percentage incorporation of the band gap widening element is graded from a maximum at interfaces of the intrinsic layer with doped layers to a minimum adjacent to but interior of the intrinsic layer.

The band gap of the intrinsic layer is substantially continuously graded from the widest band gap portion at each of the interfaces thereof with the oppositely disposed doped layers to a central non-graded region interiorly of the bulk of the intrinsic layer, said central region having a band gap of approximately 1.2–1.6 eV. The photovoltaic device may include at least one additional solar cell disposed in optical and electrical series relation to said one solar cell so as to form a tandem photovoltaic structure. The at least one additional solar cell is fabricated to include an intrinsic layer of thin film substantially amorphous semiconductor alloy material sandwiched between oppositely doped layers of semiconductor alloy material. The additional intrinsic layers are characterized by a portion of the thickness thereof having a first band gap and a portion of the thickness thereof having a second, minimum band gap more narrow then the first band gap. The band gap of the intrinsic layer of said additional cell is spatially graded over a portion of the bulk thickness of said intrinsic layer, said graded portion including a region removed from the intrinsic layer-dopant layer interfaces.

The minimum band gap semiconductor alloy material of the intrinsic layer of the additional solar cell differs from the minimum band gap semiconductor alloy material of the intrinsic layer of said one solar cell. The band gap and thickness of the intrinsic layers of the one solar cell and the at least one additional solar cell are such that the current photogenerated in each is substantially matched. The light incident doped layer of each cell is fabricated from p-type microcrystalline semiconductor alloy material and the oppositely disposed doped layer of each cell is fabricated from n-type microcrystalline semiconductor alloy material. A dual layer back reflector is operatively disposed below the lowermost n-type ayer, which back reflector is fabricated from a transparent oxide uppermost layer (such as zinc oxide) and a highly reflective lowermost layer (such as silver). A buffer layer is operatively disposed between each of the discrete layers of semiconductor alloy material in each of the cells of the photovoltaic structure.

In a second preferred embodiment of the subject invention, there is disclosed a solar cell which includes at least one intrinsic layer of thin film substantially amorphous semiconductor alloy material. The intrinsic layer is characterized by a first band gap in a portion of the thickness thereof and a second, minimum band gap portion more narrow than the first band gap portion. The intrinsic layer is disposed between the oppositely doped layers of semiconductor alloy material with the band gap of all portions of the intrinsic layer which are not contiguous to the intrinsic layer-dopant layer interfaces characterized by a band gap less than the band gap of the dopant layers. The improvement in this cell structure is that the intrinsic layer of the cell is spatially graded so that that said cell, will, upon illumination, provide an open circuit voltage greater then the open circuit voltage provided by that portion of the intrinsic layer which is fabricated from the minimum band gap semiconductor alloy material. The structural configuration and composition of the solar cell is substantially identical to the structure and composition of the solar cell described in detail hereinabove.

BRIEF DESCRIPTION OF THE DRAWINGS

FIG. 9A is a schematic representation of an about 5000 angstrom thick, spatially modulated, approximately 1.5–1.7 eV optical band gap solar cell (sample No. 2195) with associated interfacial and buffer layers which cell is intended to serve as the reference point for measuring the improved solar cell design of the instant invention;

FIG. 9B is an IV curve of the about 5000 angstrom thick, spatially modulated, approximately 1.5–1.7 eV optical band gap solar cell of FIG. 9A, said curve illustrating the measured $V_{oc}$, $J_{sc}$, and fill factor of said cell.

DETAILED DESCRIPTION OF THE DRAWINGS

1. The Photovoltaic Cell

Figure 1:
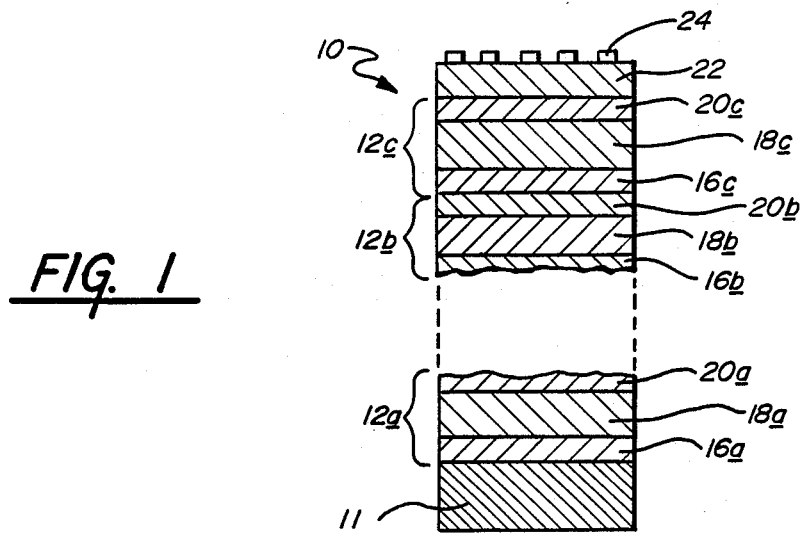
FIG. 1 is a fragmentary, cross-sectional view of a tandem photovoltaic device, said device comprising a plurality of p-i-n type cells, each layer of the cells formed from a semiconductor alloy material.

Referring now to the drawings and particularly to FIG. 1, a photovoltaic cell, formed of a plurality of successively deposited p-i-n layers, each of which includes, preferably, a thin film layer of semiconductor alloy material, and at least one of said layers formed of n-doped and p-doped wide band gap, microcrystalline semiconductor alloy material is shown generally by the reference numeral 10.

More particularly, FIG. 1 shows a p-i-n type photovoltaic device such as a solar cell made up of individual p-i-n type cells 12a, 12b and 12c. Below the lowermost cell 12a is a substrate 11 which may be transparent or formed from a metallic material such as stainless steel, aluminum, tantalum, molybdenum, chrome or metallic particles imbedded within an insulator. Although certain applications may require a thin oxide layer and/or a series of base contacts prior to the application of the amorphous material, for purposes of this application, the term "substrate" shall include not only a flexible film, but also any elements added thereto by preliminary processing. Also included within the scope of the present invention are substrates formed of glass or a glass-like material, such as a synthetic polymeric resin on which an electrically conductive electrode is applied.

Each of the cells 12a, 12b and 12c are preferably fabricated within film semiconductor bodies containing at least a silicon alloy material. Each of the semiconductor bodies includes an n-type conductivity semiconductor layer 20a, 20b or 20c; a substantially intrinsic semiconductor layer 18a, 18b or 18c; and a p-type conductivity semiconductor layer 16a, 16b or 16c. Note that the intrinsic layer may include traces of n-type or p-type dopant material without forfeiting its characteristic neutrality; hence it may be referred to herein as a "substantially intrinsic layer". As illustrated, cell 12b is an intermediate cell and as indicated in FIG. 1, additional intermediate cells may be stacked atop the illustrated cells without departing from the spirit or scope of the present invention. Also, although p-i-n photovoltaic cells are illustrated, the methods and materials disclosed herein may also be utilized to produce single or multiple n-i-n cells and p-n cells.

It is to be understood that following the deposition of the semiconductor alloy layers a further deposition process may be either performed in a separate environment or as part of the continuous process. In this step, a TCO (transparent conductive oxide) layer is added. An electrode grid may be added to the device where the cells of a sufficiently large area or if the conductivity of a TCO layer is insufficient. The grid 24 is adapted to shorten the carrier path and increase the conduction efficiency of photogenerated charge carriers.

EXAMPLES

Specific examples will now be presented to illustrate the potential ramifications which the concepts of the instant invention may have on the broad field of amorphous silicon alloy solar cell design. While specific reference will be made to single p-i-n type thin film photovoltaic cells, it is to be understood that the aforementioned ramifications of the inventive concepts disclosed herein have the most significance when applied to double and triple stacked photovoltaic structures (of particular importance is an improved 1.5 eV bottommost solar cell of a dual band gap triple stacked photovoltaic structure and an improved 1.5 eV or lower band gap solar cell for the middle and bottommost cells of a triple band gap, triple stacked photovoltaic structure).

Regardless of final structural configuration, the p-type, intrinsic and n-type layers of such single cells will be fabricated from a similar variety of precursor process gases, (such as silane, disilane, silicon tetrafluoride, germane, phosphine, boron trifluoride, argon and hydrogen), which gaseous precursor combinations are deposited onto a small area plate of substrate material. As used, in each of the following examples, the plate of substrate material is highly polished number 430 stainless steel. In order to provide for the back reflection of nonabsorbed photons of the incident solar spectrum, there is deposited (as by sputtering atop said plate of stainless steel) a thin layer of highly reflective, specular silver to a uniform thickness of approximately 1000 angstroms (thick enough to obtain coverage despite the agglomerative nature of the silver material). In most cases, the sputtering process is carried out at a nominal substrate temperature of about 200 degrees Centigrade, at which temperature a slightly textured deposition surface is created (hereinafter referred to as "an ordinary back reflector"). However, in those instances in which optimum solar cell performance is to be measured, the substrate temperature is raised to about 600 degrees Centigrade to provide a back reflective layer characterized by optimum feature sizes to promote photon scattering at angles adapted to deliver total internal reflection of incident photons.

Deposited atop said 1000 angstrom thick layer of textured silver, is a layer of zinc oxide. The layer of zinc oxide is sputter deposited, in a conventional fashion, to a uniform thickness of approximately 5000 angstroms at temperatures of about 400 degrees Centigrade. This 5000 angstrom thick layer is transparent, conductive, prevents interdiffusion of the subjacent layer of silver and the superjacent layer of amorphous silicon alloy material and interacts with the textured silver to enhance the light capturing properties so as to achieve the aforementioned goal of total internal reflection.

The detailed processes by which the n-i-p type photovoltaic structure of the instant invention can be fabricated and the observed values of critical cell operational characteristics (such as open circuit voltage, short circuit current and fill factor) are set forth in the detailed examples which follow hereinbelow. It is to be specifically noted that, and as should be evident from the foregoing sections of the specification, it is the design of the intrinsic layer and associated interfacial buffer layers which will be modified so as to enhance open circuit voltage, short circuit current and/or fill factor toward the ultimate goal of improved multigap, spectrum splitting solar cell efficiency.

EXAMPLE I

The p-i-n type photovoltaic cell of this example is formed with a constant optical band gap intrinsic layer of about 1.5 eV, amorphous silicon germanium alloy material. It is intended that said cell will serve as the base line or standard reference point by which the more innovative designs of the subject invention may be measured. It is to be kept in mind that the specific values of cell performance derived from the cell fabrication process detailed in this Example I are typical of those expected from state-of-the art cells fabricated with about 1.5 eV intrinsic layers. Said cell was identified in the inventor's laboratory notebook as sample Number 2130.

This n-i-p type cell was prepared in the following manner. The small area plate of substrate material with the dual layered back reflective materials deposited thereupon was placed in an evacuated deposition chamber, which chamber was held at approximately 300 degrees Centigrade and at a pressure of about 0.6 Torr. Thereafter, the following precursor process gases were introduced into said chamber at the following flow rates so as to effect the deposition of the n-type layer of silicon hydrogen alloy material:

| Gas | Flow Rate |
| --- | --- |
| Silane (SiH$_4$) | 0.2 SCCM |
| Phosphine (PH$_3$) | 0.4 SCCM |
| (1% phosphine diluted in H$_2$) | |
| Argon (Ar) | 39.4 SCCM |

The plate of substrate material and precursor process gases were then energized by a 1.5 watt source of 13.56 MHz RF energy for approximately three (3) minutes. The result of this process was the deposition of said 150–200 angstrom thick layer of n-type amorphous silicon hydrogen alloy material.

While the n+ layers in these patent examples have been fabricated solely utilizing amorphous layers, we anticipate that with a microcrystalline n+ layer, as described in our commonly assigned, copending U.S. patent application Ser. No. 077,722 filed July 27, 1987 by S. Guha and S. R. Ovshinsky for N-Type Microcrystalline Semiconductor Alloy Including Band Gap Widening Elements, Methods Of Fabricating Same, And Devices Utilizing Same incorporated herein by reference, cell parameters, for example $V_{oc}$ and fill factor will be improved. This improvement is due to the high built in field and the wide optical band gap.

Prior to the deposition of said intrinsic layer of amorphous silicon germanium alloy material, it is necessary to specially treat the exposed surface of the n+ layer so as to reduce interfacial recombination. In connection therewith, it is to be understood that both the n− layer/intrinsic layer interface, as well as the p− layer/intrinsic layer interface are formed with specific interfacial buffer layers, said buffer layers being fabricated from substantially intrinsic layer precursor process gases (for depositing low defect density material), which gases are introduced into the deposition chamber in the following ratios and at the following flow rates:

| Gas | Flow Rate |
| --- | --- |
| Disilane (Si$_2$H$_6$) | 0.55 SCCM |
| Boron tri-fluoride (BF$_3$) (40 ppm BF$_3$, diluted in H$_2$) | 0.3 SCCM |
| Hydrogen (H$_2$) | 48.0 SCCM |
| Germane (GeH$_4$) | Ramped from 0.0 SCCM to 0.3 SCCM over 1 minute, held at 0.3 SCCM for 27.5 minutes, and ramped from 0.3 SCCM to 0.0 SCCM over 1.5 minutes |

It is important to note that the germane (GeH$_4$) inlet valve remains open during the entire 30 minute interval, although the flow rate is increased and decreased via a manual flow control. This procedure has the effect of preventing a germane pressure "spike" when the gas is first introduced into the deposition chamber and has the further effect of providing for the smooth introduction of vanishingly small amounts of germanium into the top and bottom buffer layers. Note that the purpose of the interfacial buffer layers is to reduce the interfacial recombination of photogenerated charge carriers by eliminating the presence of a sharp transition zone or spike which would otherwise exist between the wide band gap doped layers of microcrystalline silicon alloy material and the more narrow optical band gap layer of intrinsic amorphous silicon alloy material.

In order to effectuate the deposition of the intrinsic layer, the plate of substrate material with the dual-layered back reflector and the n-type layer deposited thereupon is subjected to deposition conditions substantially similar to those described above (about 300° C., about 1.2 Torr and about 1 watt) in the presence of a mixture of precursor process gases adapted to glow discharge deposit an intrinsic layer of amorphous silicon germanium hydrogen fluorine material. The bottom, interfacial buffer layer is formed during the first minute of the intrinsic layer deposition process by progressively increasing the germane (GeH$_4$) gas flow rate from about 0.0 SCCM to about 0.3 SCCM while maintaining the flow rates of the other feedstock gases constant. The resulting interfacial layer of steadily increasing germanium content is again intended to provide a smooth transition between the 1.5 eV optical band gap intrinsic layer and the wider band gap buffer layer so as to avoid the presence of an impediment to charge carrier movement. Said interfacial layer is essentially an amorphous silicon hydrogen alloy material with trace amounts of boron and fluorine and gradually increasing germanium content, which layer is deposited for a period of about 60 seconds so as to assume a total thickness of approximately 100 angstroms.

The 1.5eV band gap intrinsic layer is formed during the 27.5 minutes period immediately following the deposition of the bottom interfacial layer. During this period all of the aforementioned deposition conditions, as defined above, are held constant, including the flow rate of the germane (at about 0.3 SCCM). The result is the deposition of a layer of a substantially intrinsic, amorphous silicon germanium hydrogen fluorine alloy material, said intrinsic layer deposited to a thickness of approximately 2750 angstroms. It is noteworthy that this is the active photogenerative layer of the solar cell and is therefore the layer of the, cell in which the density of defect states should be reduced to a minimum; however, due to the fact that the germanium content is about 30% to 40% so as to provide about 1.5eV band gap amorphous silicon germanium alloy material, the density of states is higher than that of non-germanium containing intrinsic silicon alloy material. The reasons that the defect density increases with increasing germanium content has been explained hereinabove, and need not be detailed again. However, this increased defect density must be taken into consideration in the intrinsic layer designs disclosed in the Examples which follow.

Immediately following the 27.5 minute intrinsic layer deposition period, the germane flow rate is ramped down from about 0.3 SCCM to about 0.0 SCCM over approximately a 1.5 minute time period, which slow ramp down period results in the formation of a top interfacial layer in contact with the subsequently deposited p+ layer. This interfacial layer is formed of an amorphous silicon fluorine hydrogen boron alloy material (without germanium) so as to eliminate a spiked condition in the band gap thereof which would impede charge carrier collection. Thereafter, the flow rate of all of the remaining intrinsic layer process gases are reduced to about 0.0 SCCM, and a hydrogen plasma is initiated. Said hydrogen plasma is maintained for approximately 30 seconds, during which time period the activated hydrogen diffuses through the uppermost portion of the previously deposited intrinsic layer for the purpose of satisfying dangling bonds and other defect states and further reducing intrafacial recombination of charge carriers moving past the intrinsic layer/p+ layer interface. This hydrogen plasma further creates a clean surface upon which nucleating centers for the subsequent growth of p-type microcrystalline material. A clean surface is believed to be necessary due to the fact the growth of crystallites must occur in a layer which is only on the order of 100 angstroms thick.

The last layer of the thin film solar cell to be deposited is the light incident p type layer, which layer is disposed atop the hydrogen plasma layer. Said p+ layer is deposited at 25 watts of 13.56 MHz RF energy at a nominal substrate temperature of about 250 degrees Centigrade and a pressure of about 2 Torr. The p+ layer precursor process gases are then introduced into the deposition chamber in the following ratios and the following flow rates.

| Gas | Flow Rate |
| --- | --- |
| Boron tri-fluoride (BF$_3$) (40 ppm BF$_3$, diluted in H$_2$) | 1.0 SCCM |
| Silane (SiH$_4$) | 1.0 SCCM |
| Hydrogen (H$_2$) | 48.0 SCCM |

Said precursor or feedstock gases are exposed to said 25 watt source of RF power for approximately 50 seconds, thereby resulting in the deposition of about a 100 angstroms thick layer of heavily p-doped microcrystalline silicon hydrogen fluorine material. Due to the high volume fraction of crystallites, this p+ layer exhibits a high conductivity of about 1–10 ohms$^{-1}$cm$^{-1}$ and a wide optical band gap of about 2.0 OeV so as to provide, in conjunction with the microcrystalline n+ layer, a strong built-in potential across the photogenerative intrinsic layer of the solar cell, which built-in potential aids in charge carrier collection and in splitting the quasi-Fermi level of said intrinsic layer.

The type of deposition process described hereinabove, results in the fabrication of about a 1.5 eV optical band gap, 0.05 square centimeter (these small area devices are fabricated and tested without the presence of silver conducting grid lines), n-i-p photovoltaic device; which device was characterized by the following tabularized electrical data:

TABLE

| | (Sample 2130, Example I) | | |
| --- | --- | --- | --- |
| Illumination | AM1.5 | 700 nm | Red = Blue |
| J$_{sc}$ (mA/cm$^2$) | 19.520 | 9.366 | 1.661, 1.657 |
| V$_{oc}$ (Volts) | 0.783 | 0.747 | 0.674, 0.688 |
| Fill Factor | 0.518 | 0.506 | 0.574, 0.658 |

Figure 2A:
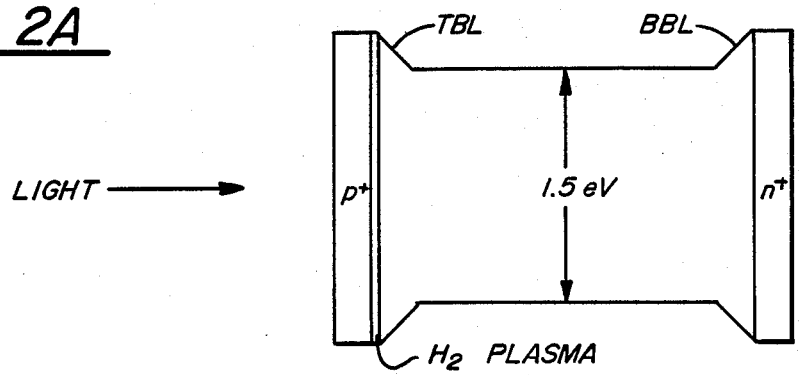
FIG. 2A is a schematic representation of a constant approximately 1.5 eV optical band gap solar cell (sample No. 2130) with associated interfacial and buffer layers, which cell is intended to serve as the reference point for measuring the improved solar cell design of the instant invention.
Figure 2B:
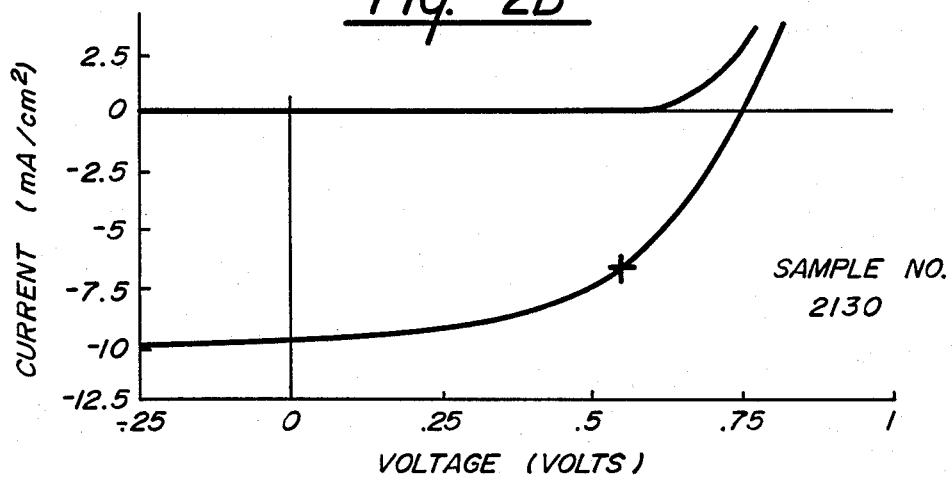
FIG. 2B is an IV curve of the constant approximately 1.5 eV optical band gap solar cell of FIG. 2A measured under 700 nanometer illumination, said curve illustrating the measured $V_{oc}$, $J_{sc}$ and fill factor of said cell.

Note that 700 nanometer (deep red) light was used because a 1.5 eV band gap solar cell, when employed in a tandem photovoltaic device structure, will see this wavelength of light; the shorter, more energetic blue wavelengths being absorbed in the uppermost cell(s) of the device. A schematic illustration of the aforedescribed solar cell design is provided in FIG. 2A, with the IV curve thereof, as measured under 700 nanometer light, provided in FIG. 2B. Note that this cell was also measured under (and the results tabulated hereinabove) AM1.5 illumination, which illumination is not red wavelength limited. Finally, note that this cell was also measured (and the results tabulated hereinabove) by substantially equalizing the photogenerated current due to blue photons and the photogenerated current to red photons of incident radiation. This equalization of blue and red current provides very useful information concerning the collection of photogenerated blue and red photons. For instance, a low blue fill factor is indicative of back diffusion of electrons into the p+ layer, while a low red fill factor is indicative of poor hole transport.

Again, the solar cell operational values set forth hereinabove provide the reference point or baseline against which the solar cell designs set forth in the following Examples will be evaluated.

EXAMPLE II

A second n-i-p type solar cell sample, identified in the inventors' lab book as sample number 2169, was prepared using essentially the same recipes as described hereinabove with respect to Example I. There were, however, significant changes in the design of the intrinsic layer of said cell, which changes necessitated the graded introduction of feedstock gases. Of course, it is to be understood that due to the graded design of the intrinsic layer, further modifications of buffer layers, interfacial layers, boron content in the intrinsic layer, etc. will be necessary in order to optimize the instant invention. In the instant example, the n-layer of amorphous silicon alloy material was deposited for only a two minute period so as to limit the thickness thereof to approximately 100 to 150 angstroms.

As mentioned in the previous paragraph, the major change in the cell configuration occurred in the design of the narrow band gap layer of intrinsic amorphous silicon germanium alloy material. Particularly, the precursor process gas mixture was free of boron tri-fluoride; and the ramp-in time of the germane gas so as to reach the appropriate concentration for the fabrication of 1.5eV band gap material was increased from 1 minute to 29 minutes. Thus the gases introduced into the deposition chamber and the respective flow rates thereof were as follows:

| Gas | Flow Rate |
|---|---|
| Disilane (Si$_2$H$_6$) | 0.5 SCCM |
| Hydrogen (H$_2$) | 48.0 SCCM |
| Germane (GeH$_4$) | Ramped from 0.0 SCCM to 0.3 SCCM over 29 minutes, then ramped down from 0.3 SCCM to 0.0 SCCM over 1 minute. |

Figure 3A:
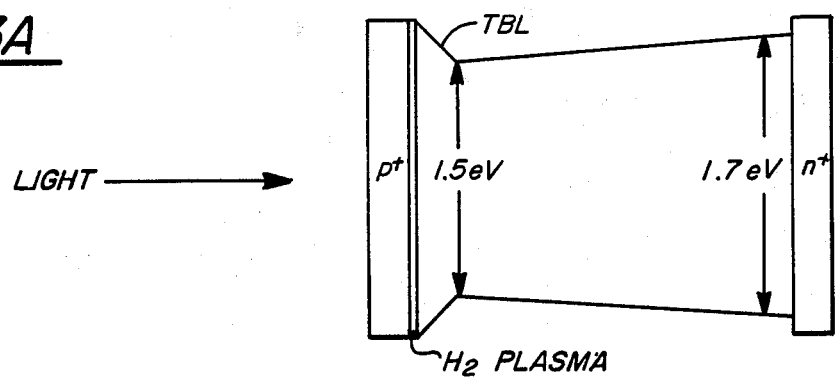
FIG. 3A is a schematic representation of an about 3000 angstrom thick, graded, approximately 1.5–1.7 eV optical band gap solar cell (sample No. 2169) with associated interfacial and buffer layers.
Figure 3B:
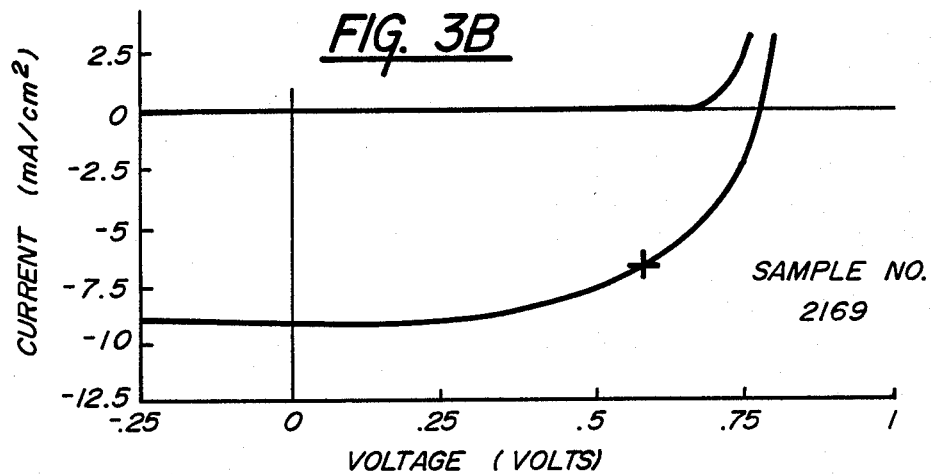
FIG. 3B is an IV curve of the about 3000 angstrom thick, graded, approximately 1.5–1.7 eV optical band gap solar cell of FIG. 3A measured under 700 nanometer illumination, said curve illustrating the measured $V_{oc}$, $J_{sc}$, and fill factor of said cell.

It therefore becomes apparent that the graded introduction of the germane was effected over a significantly longer period of time, vis-a-vis, the introduction of germane in the constant band gap sample of Example I. It is to be further noted that the step of depositing a bottom buffer layer has been eliminated. The results which will be set forth hereinafter are to be analyzed in view of the fact that no source of boron, such as BF$_3$, was introduced into the intrinsic layer to aid in the collection of holes photogenerated therein. Through the process outlined in this example, the instant inventors have profiled the band gap of the intrinsic layer of the photovoltaic device, grading said device (over a thickness of about 3000 angstroms) from a maximum of about 1.7 eV adjacent the n-layer interface to a minimum of about to 1.5 eV adjacent the p-layer interface. A schematic diagram of this cell design is illustrated in FIG. 3A with the IV curve thereof measured under 700 nanometer light provided in FIG. 3B.

The changes in the design of the intrinsic layer, described hereinabove, resulted in significant improvements in the performance of the n-i-p photovoltaic device, which improvements are tabulated hereinbelow:

TABLE

| Illumination | (Sample 2169, Example II) | | |
|---|---|---|---|
|  | AM1.5 | 700 nm | Red = Blue |
| J$_{sc}$ (mA/cm$^2$) | 17.057 | 8.968 | 1.511, 1.516 |
| V$_{oc}$ (Volts) | 0.799 | 0.779 | 0.699, 0.703 |
| Fill Factor | 0.590 | 0.590 | 0.661, 0.674 |

While the short circuit current was slightly lower than in the base line case cell of Example I, hereinabove, it is remarkable that even though no boron has been added in the intrinsic layer. The fill factor has been significantly improved. This can only be attributed to the field gradient which aids in hole transport and hence charge carrier collection. It is also important to note that the fill factor can be further improved through the addition a slight boron gradient through the intrinsic layer. This is particularly important in view of the fact that the short circuit current of a cell can be improved by increasing the thickness of the intrinsic layer thereof; however, said increased thickness makes it all the more necessary to add boron. This is because, under red illumination, charge carriers are photogenerated throughout the bulk of the intrinsic layer and holes have to make a successful journey all the way to the p+ layer in order to be collected. Therefore the addition of boron will not only improve the fill factor, but will improve hole transport to also provide for the fabrication of a thicker intrinsic layer so as to enhance J$_{sc}$.

EXAMPLE III

Figure 4A:
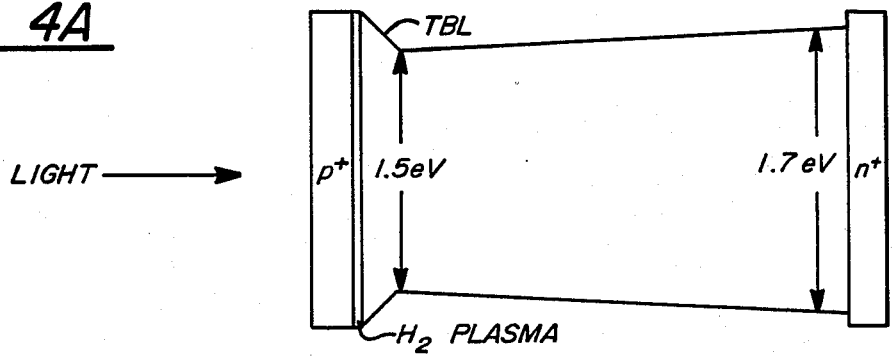
FIG. 4A is a schematic representation of an about 4000 angstrom thick, graded, approximately 1.5–1.7 eV optical band gap solar cell (sample No. 2171) with associated interfacial and buffer layers.
Figure 4B:
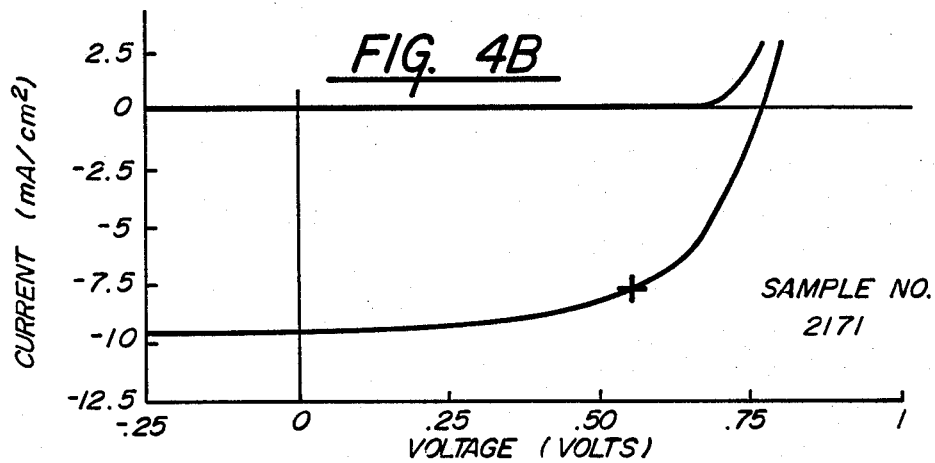
FIG. 4B is an IV curve of the about 4000 angstrom thick, graded, approximately 1.5–1.7 eV optical band gap solar cell of FIG. 4A measured under 700 nanometer illumination, said curve illustrating the measured $V_{oc}$, $J_{sc}$, and fill factor of said cell.

The present inventors prepared a third sample identified in their lab notebook as sample number 2171. The method employed in preparing said sample is substantially identical to that described hereinabove in describing the fabrication of sample No. 2169 of Example II. The only change in deposition parameters in the preparation of instant sample number 2171 was to increase the time period in which the germane flow rate was ramped from 0.0 SCCM to 0.3 SCCM so that additional photons of deep red light could be collected so as to enhance short circuit current density, J$_{sc}$. More particularly, said ramping function was accomplished over a 39 minute time period, instead of the 29 minute time period set forth in Example II. All other deposition parameters remained constant. In this manner, a substantially 4000 angstrom thick intrinsic layer of silicon germanium alloy material was deposited, which intrinsic layer was profiled from a maximum band gap portion of about 1.7 eV adjacent the n-layer interface to a minimum band gap portion of about 1.5 eV adjacent the p-layer interface. A schematic diagram of this cell design, including the profiled intrinsic layer, is illustrated in FIG. 4A, with the IV curve thereof as measured under 700 nanometer illumination provided in FIG. 4B.

The fabrication process employed in the manufacture of sample number 2171 resulted in the design of an n-i-p photovoltaic device with improvements in electrical parameters which are tabulated hereinbelow:

TABLE

| Illumination | (Sample 2171, Example III) | | |
|---|---|---|---|
|  | AM1.5 | 700 nm | Red = Blue |
| J$_{sc}$ (mA/cm$^2$) | 18.212 | 9.396 | 1.498, 1.408 |
| V$_{oc}$ (Volts) | 0.790 | 0.761 | 0.685, 0.688 |
| Fill Factor | 0.537 | 0.573 | 0.645, 0.621 |

These results demonstrate significant improvement over the standard amorphous silicon:germanium alloy photovoltaic cell of Example I.It is interesting to note that even though the sample cell is thicker than the cell described in Example I, the fill factor is still higher because of the graded field which aids in charge carrier movement. Further, and, as predicted, the thicker intrinsic layer of the instant sample resulted in an increase in photogenerated short circuit current vis-a-vis the Example II cell.

EXAMPLE IV

Figure 5A:
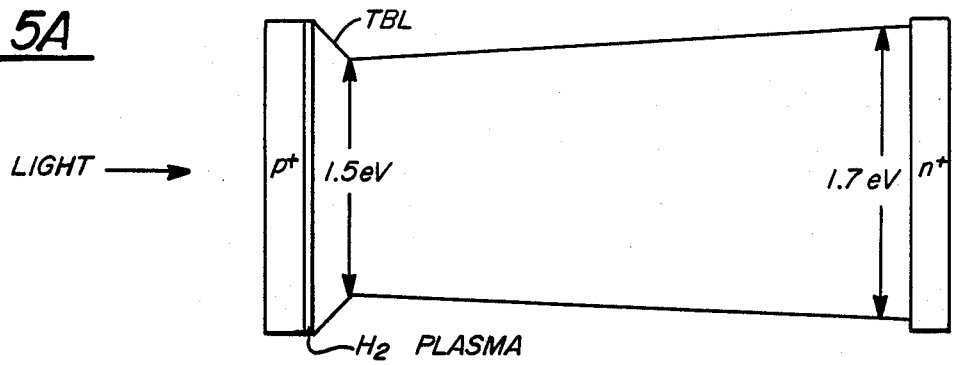
FIG. 5A is a schematic representation of an about 5000 angstrom thick, graded, approximately 1.5–1.7 eV optical band gap solar cell (sample No. 2172) with associated interfacial and buffer layers.
Figure 5B:
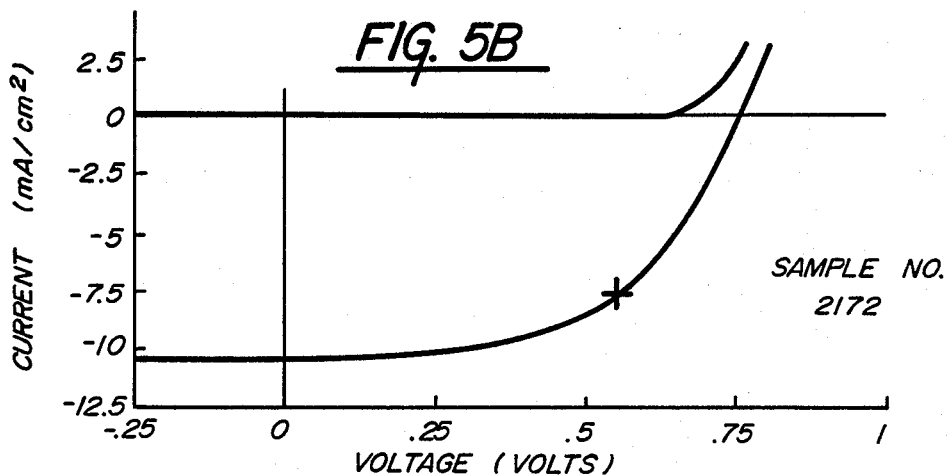
FIG. 5B is an IV curve of the about 5000 angstrom thick, graded, approximately 1.5–1.7 eV optical band gap solar cell of FIG. 5A measured under 700 nanometer illumination, said curve illustrating the measured $V_{oc}$, $J_{sc}$, and fill factor of said cell.

The present inventors further prepared a fourth sample identified in their lab notebook as sample number 2172. Sample No. 2172 was prepared in essentially the same manner as described hereinabove with reference to sample number 2171. The only change in deposition parameters in the preparation of the instant sample was to increase the time period in which the germane flow rate was ramped from about 0.0 SCCM to about 0.3 SCCM. More particularly, the ramping function was accomplished over a 49 minute time period prior to being ramped down from about 0.3 SCCM to about 0.0 SCCM over a 1 minute time period. In this manner, and with all other parameters unchanged, a substantially 5000 angstrom thick intrinsic layer of silicon germanium alloy material was deposited, with said intrinsic layer being profiled from a maximum optical band gap of about 1.7 eV adjacent the n-layer interface to a minimum band gap of about 1.5 eV adjacent the p-layer interface. A schematic diagram of this cell design including the profiled intrinsic layer, is illustrated in FIG. 5A with the IV curve thereof measured under 700 nanometer illumination provided in FIG. 5B.

The fabrication process employed in the manufacture of sample No. 2172 resulted in the design of a n-i-p photovoltaic device which demonstrated the following electrical characteristics tabulated hereinbelow:

TABLE

| | (Sample 2172, Example IV) | | |
|---|---|---|---|
| Illumination | AM1.5 | 700 nm | Red = Blue |
| $J_{sc}$ (mA/cm$^2$) | 19.053 | 9.869 | 1.527, 1.512 |
| $V_{oc}$ (Volts) | 0.793 | 0.762 | 0.686, 0.696 |
| Fill Factor | 0.544 | 0.540 | 0.624, 0.657 |

As can be observed by comparing the performance values for sample 2172 disclosed in the instant Example with those performance values disclosed for the base line cell, sample 2130 of Example I, both the fill factor and the $V_{oc}$ are above the values measured for said standard amorphous silicon:germanium alloy intrinsic layer cell of Example I. As predicted, the value of the short circuit current continues to increase with the thickness of the graded intrinsic layers and this increase is not offset by a reduced fill factor which is also greater than that of Example I. Moreover, the open circuit voltage has not decreased relative to that measured in Example III. Note that as the thickness of the cell increases, some loss in $V_{oc}$ can be predicted due to the recombination caused by that additional thickness; therefore, it is not surprising that the 3000 angstrom thick intrinsic layer cell of Example II would develop a higher $V_{oc}$ than that of Examples III and IV.

EXAMPLE V

Figure 6A:
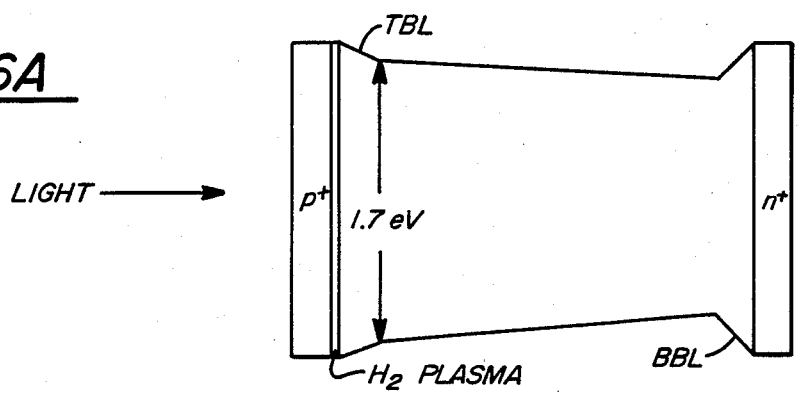
FIG. 6A is a schematic representation of an about 3000 angstrom thick, graded (with the wider band gap at the p+ layer), approximately 1.5–1.7 eV optical band gap solar cell (sample No. 2174) with associated interfacial and buffer layers.
Figure 6B:
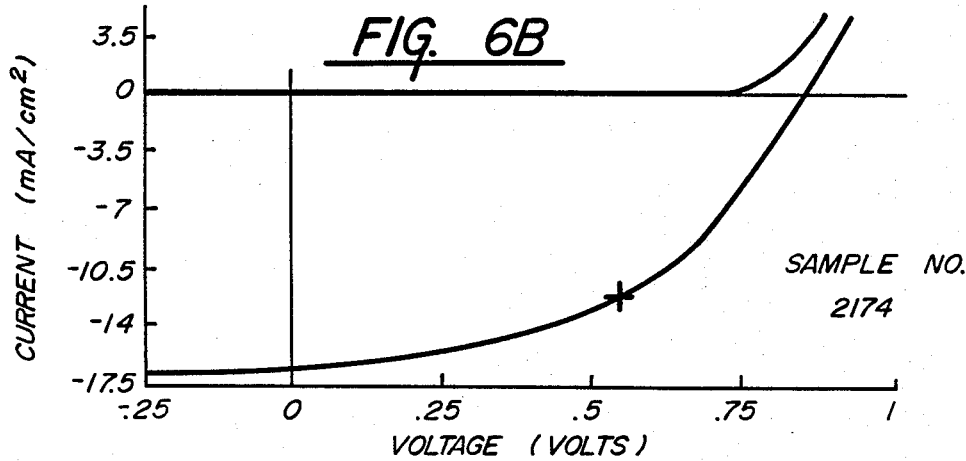
FIG. 6B is an IV curve of the about 3000 angstrom thick, graded (with the wider band gap at the p+ layer), approximately 1.5–1.7 eV optical band gap solar cell of FIG. 6A measured under AM1.5 illumination, said curve illustrating the measured $V_{oc}$, $J_{sc}$ and fill factor of said cell.

A fifth sample, designated by the lab notebook sample number 2174 was fabricated in substantial accordance with the deposition process outlined in Example II, described hereinabove with respect to sample No. 2169. However, the instant sample No. 2174 was prepared in such a manner that the intrinsic layer of silicon germanium alloy material there was gradingly fabricated with the about 1.7 eV wider band gap material disposed adjacent the p+ layer of microcrystalline material and the about 1.5 eV narrower band gap material disposed adjacent the n+ layer of amorphous material. More particularly, following the deposition of the n+ layer, the germane gas was ramped from about 0.03 SCCM adjacent said n+ layer interface to about 0.00 SCCM adjacent the p+ layer over a time period of approximately 29 minutes. The top buffer layer was then deposited by continuing the glow discharge (without introducing any germane gas flow) so as to provide an interfacial buffer between the p+ layer and the intrinsic layer, which buffer layer, as detailed previously, is adapted to reduce the recombination of photogenerated charge carriers at said intrinsic/p+ layer interface. A schematic diagram of this cell design, including the band gap profiled intrinsic layer of the instant invention, having an overall intrinsic layer thickness of about 3000 angstroms, is illustrated in FIG. 6A, with the IV curve thereof, as measured under AM1.5 illumination, provided in FIG. 6B.

The n-i-p photovoltaic device fabricated in this manner, with the band gap thereof graded from a maximum at the p+ layer interface, demonstrated solar cell performance characteristics showing remarkable open circuit voltage. Specifically, this solar cell provided the following measured electrical characteristics tabulated hereinbelow:

TABLE

| | (Sample 2174, Example V) | | |
|---|---|---|---|
| Illumination | AM1.5 | 700 nm | Red = Blue |
| $J_{sc}$ (mA/cm$^2$) | 16.444 | 7.670 | 1.570, 1.628 |
| $V_{oc}$ (Volts) | 0.860 | 0.805 | 0.738, 0.778 |
| Fill Factor | 0.465 | 0.418 | 0.462, 0.678 |

The truly intriguing result was the very high open circuit voltage value of 0.860 volts, which value must be compared with the value of 0.747 volts set forth in Example I for the base-line solar cell, an increase of 113 millivolts. The fill factor is lower than in the standard cell of Example I, but it can be improved by optimizing the boron profiling in the intrinsic layer.

EXAMPLE VI

As can be seen from a review of the foregoing examples, in the first case the instant inventors have provided a substantial increase in $V_{oc}$ by operatively disposing the wide band gap portion of the intrinsic layer adjacent the light incident doped layer of the cell (although the fill factor decreased); in the second case, the instant inventors have provided a substantial improvement in $J_{sc}$ and fill factor (although the $V_{oc}$ was only marginally enhanced). Therefore, in this Example, the intrinsic layer was spatially modulated from a widest band gap at the light incident doped layer, quickly ramped down to a minimum band gap portion, then slowly ramped back up to a widest band gap at the opposite doped layer. In this manner, the inventors were seeking to "marry" the performance of the two cases set forth hereinabove so as to significantly improve every critical electrical characteristic of solar cell performance.

Figure 7A:
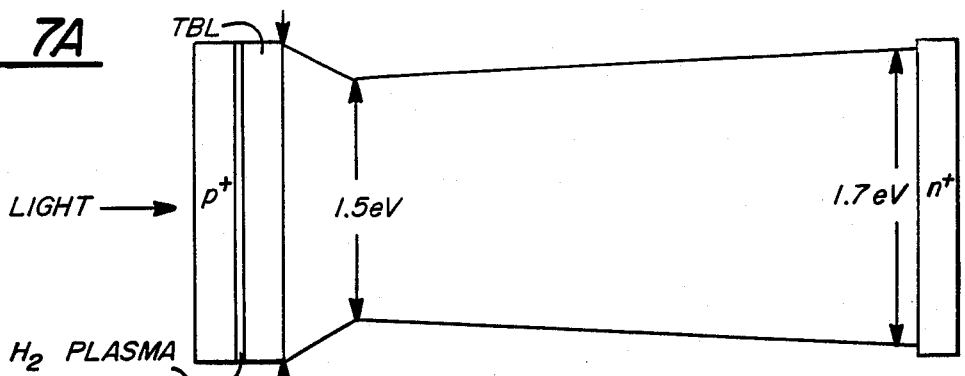
FIG. 7A is a schematic representation of an about 5500 angstrom thick, spatially modulated, approximately 1.5–1.7 eV optical band gap solar cell (sample No. 2191) with associated interfacial and buffer layers.
Figure 7B:
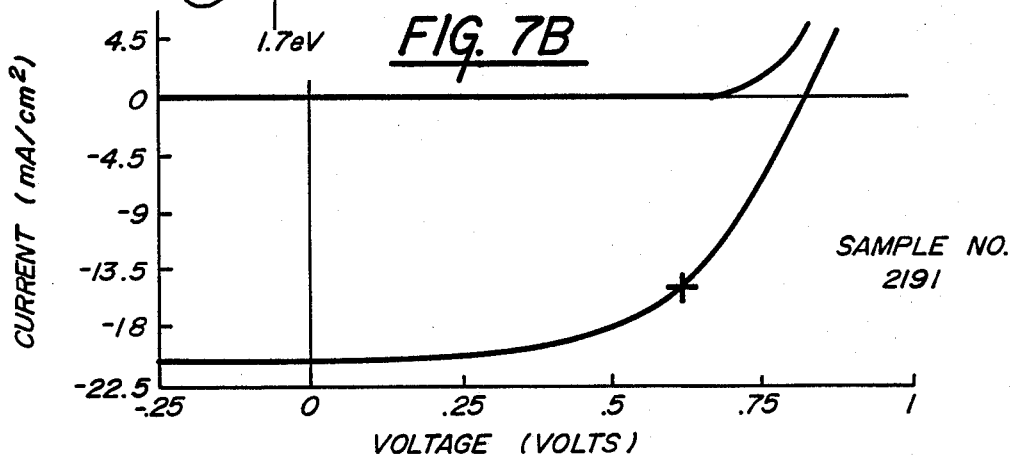
FIG. 7B is an IV curve of the about 5500 angstrom thick, spatially modulated, approximately 1.5–1.7 eV optical band gap solar cell of FIG. 7A measured under AM1.5 illumination, said curve illustrating the measured $V_{oc}$, $J_{sc}$ and fill factor of said cell.

A sixth sample, designated by the lab notebook number 2191, was fabricated according to the process described hereinabove for Examples II–V. In this Example, the time of deposition and the germane flow rate for the intrinsic layer was varied relative to the process described in Example IV. More particularly, following the deposition of the n+ layer of microcrystalline silicon alloy material, the intrinsic layer of germanium silicon alloy material is formed in a 55 minute deposition process wherein the germane flow rate is ramped from about 0.0 SCCM at the n+ layer interface up to about 0.3 SCCM over a fifty minute time interval, and is then ramped from about 0.3 SCCM to about 0.0 SCCM at the p+ layer interface over a 5 minute time interval. The resulting intrinsic layer is characterized by a band gap which is graded from about 1.7 eV adjacent the n+ layer, down to about 1.5 eV centrally thereof and then back up to about about 1.7 eV adjacent the p-layer interface. After the ramping down to about a 0.00 SCCM flow of germane has been completed, a top buffer layer is deposited by introducing the intrinsic layer feedstock gases (absent said germanium-containing precursor). A schematic diagram of this spatially modulated cell design, including the double profiled intrinsic layer having an overall thickness of about 5500 angstroms, is illustrated in FIG. 7A with the IV curve thereof, as measured under AM1.5 illumination, provided in FIG. 7B.

The n-i-p photovoltaic device fabricated in this manner demonstrated characteristics superior to those of all of the graded or constant band gap photovoltaic devices described hereinabove. Specifically, said double profiled (DPI, Double Profiled Instrinsic layer) cell was fabricated with the following measured electrical characteristics tabulated hereinbelow:

TABLE

| | (Sample 2191, Example VI) | | |
|---|---|---|---|
| Illumination | AM1.5 | 700 nm | Red = Blue |
| $J_{sc}$ (mA/cm$^2$) | 20.432 | 10.468 | 1.797, 1.765 |
| $V_{oc}$ (Volts) | 0.838 | 0.802 | 0.737, 0.756 |
| Fill Factor | 0.511 | 0.475 | 0.552, 0.710 |

This provided a solar cell photoconversion efficiency of 9.6879. If this efficiency is normalized to demonstrate performance under AM1 illumination (a gain of 7% in intensity of incident radiation), the cell would measure an efficiency of about 10.37%, a NEW WORLD RECORD for a 1.5 eV band gap amorphous silicon germanium alloy solar cell. Finally, note that when the blue and red currents photogenerated under 700 nanometer illumination are matched, (1) a large enhancement in $V_{oc}$ can be seen; however (2) the red fill factor is only about 0.546, thereby indicating problems in hole transport to the p+ layer. Again, a solution to the problem of hole collection would be the boron doping of the intrinsic layer which could be utilized to improve hole transport.

It must be explained that the plate of substrate material utilized for this experiment had deposited thereupon the best possible back reflector, i.e., a textured back reflector characterized by substantially ideal surface features to provide for scattering of photons at optimum angles from the textured surface thereof.

EXAMPLE VII

Figure 8A:
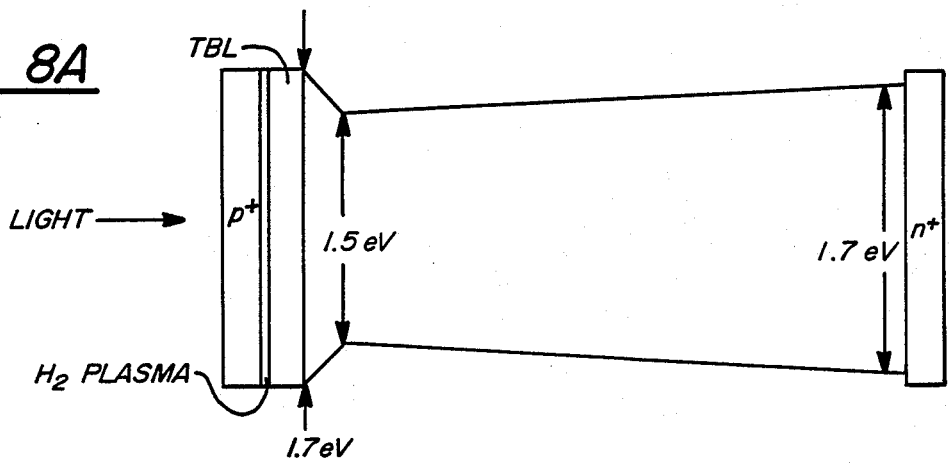
FIG. 8A is a schematic representation of an about 5500 angstrom thick, spatially modulated approximately 1.5–1.7 eV optical band gap solar cell (sample No. 2190) with associated interfacial and buffer layers.
Figure 8B:
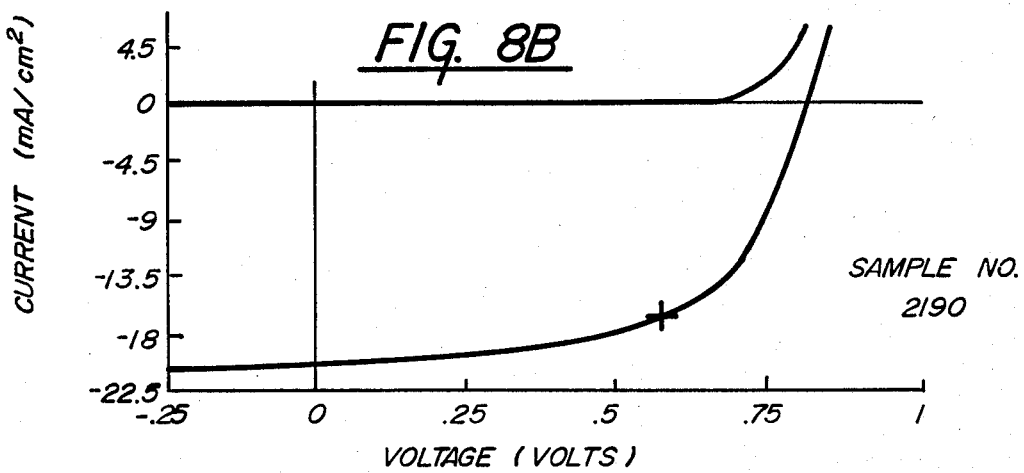
FIG. 8B is an IV curve of the about 5500 angstrom thick, spatially modulated, approximately 1.5–1.7 eV optical band gap solar cell of FIG. 8A measured under AM1.5 illumination, said curve illustrating the measured $V_{oc}$, $J_{sc}$, and fill factor of said cell.

A seventh sample, designated by the lab notebook sample number 2190 was fabricated in substantial accordance with the deposition process outlined in detail with respect to sample No. 2191 hereinabove. This Example varies from Example VI only in the length of time in which the intrinsic layer of silicon germanium alloy material was ramped from the minimum optical band gap value of about 1.5 eV to a band gap value of about 1.7 eV adjacent the p+ layer interface. More particularly, following the deposition of the n+ layer of amorphous silicon alloy material, the intrinsic layer is formed in a 55 minute deposition process wherein the germane flow rate is ramped from about 0.0 SCCM adjacent the n+ layer interface up to about 0.3 SCCM over about a 50 minute time interval and then is ramped down from about 0.3 SCCM to about 0.00 SCCM adjacent the p+ layer interface over about a 2 minute time interval. The one minute non-germanium containing plasma then completes the deposition of the intrinsic layer. A schematic diagram of this spatially modulated cell design, including the double profiled intrinsic layer, having an overall thickness of about 5200 angstroms, is illustrated in FIG. 8A with the IV curve thereof, as measured under AM1.5 illumination, provided in FIG. 8B.

The n-i-p photovoltaic device fabricated in this manner demonstrated solar cell performance characteristics marginally superior to those set forth in the world record cell detailed in Example V hereinabove. Specifically, said double profiled intrinsic (DPI) cell provided the following measured electrical characteristics tabulated hereinbelow:

TABLE

| | (Sample 2190, Example VII) | | |
|---|---|---|---|
| Illumination | AM1.5 | 700 nm | Red = Blue |
| $J_{sc}$ (mA/cm$^2$) | 20.120 | 10.453 | 1.698, 1.696 |
| $V_{oc}$ (Volts) | 0.804 | 0.770 | 0.687, 0.702 |
| Fill Factor | 0.515 | 0.527 | 0.601, 0.652 |

The AM1.5 measurements calculate to a photoconversion efficiency of about 9.760%. Again, by converting this photoconversion efficiency measured under AM1.5 illumination to AM1 illumination, the efficiency measures about 10.44%, another WORLD RECORD for an approximately 1.5 eV band gap solar cell. Once again, room for further improvement is apparent because no boron has been added to the intrinsic layer in order to improve hole conduction.

EXAMPLE VIII

An eighth sample, designated by the lab notebook sample number 2195 was fabricated in substantial accordance with the deposition process outlined in detail with respect to sample 2191 (Example VI) hereinabove. This Example differs from Example VI only in the addition of a boron-containing precursor to the gaseous mixture for depositing the intrinsic layer of silicon germanium alloy material. Further, the boron precursor was graded so as to correspond to the profile of the germanium in the intrinsic layer. More particularly, following the deposition of the n+ layer of amorphous silicon alloy material, the intrinsic layer is formed in a 55 minute deposition process wherein the germane flow rate is ramped up from about 0.0 SCCM adjacent the n+ layer interface up to about 0.3 SCCM over about a 50 minute time interval and then is ramped down from about 0.3 SCCM to about 0.00 SCCM adjacent the p+ layer interface over about a 2 minute time interval. During the deposition of the intrinsic layer, about 0.2 SCCM of BF$_3$ is added to the gaseous precursor mixture for 30 minutes and then the flow rate of BF$_3$ is ramped up to about 0.4 SCCM. The one minute non-germanium containing plasma then completes the deposition of the intrinsic layer. A schematic diagram of this spatially modulated cell design, including the double profiled intrinsic layer, having an overall thickness of about 5200 angstroms, is illustrated in FIG. 9A with the IV curve thereof, as measured under AM1.5 illumination, provided in FIG. 9B.

The n-i-p photovoltaic device fabricated in this manner demonstrated solar cell performance characteristics under red illumination superior to those set forth in the world record cell detailed in Example VI and VII hereinabove. Specifically, said double profiled intrinsic (DPI) layer with profiled dopant provided the following electrical characteristics tabulated hereinbelow:

TABLE (Sample 2195, Example VIII)

| Illumination | AM1.5 | 700 nm | Red = Blue |
|---|---|---|---|
| $J_{sc}$ (mA/cm$^2$) | 19.880 | 10.582 | 2.124, 2.106 |
| $V_{oc}$ (Volts) | 0.831 | 0.798 | 0.740, 0.756 |
| Fill Factor | 0.533 | 0.499 | 0.585, 0.697 |

The AM1.5 measurements calculate to a solar cell photoconversion efficiency of about 8.806. Again, by converting this efficiency to AM1 illumination, the efficiency measures about 10.3, another WORLD RECORD for an approximately 1.5 eV band gap solar cell. Note that, as predicted hereinabove, the addition of a boron gradient provided a "boost" to hole movement in the region of the intrinsic layer which has the greatest defect density (the narrowmost band gap material) and thereby improved hole collection and red fill factor.

While BF$_3$ is shown as the source of B to improve hole collection, and also to provide F, which the Assignee of the instant invention has shown provides a better narrow band gap material, with a lower density of defect states in the gap and higher stability, it is to be understood that other precursor sources of boron could be used.

EXAMPLE IX

An n-i-p solar cell was prepared with an intrinsic layer graded in boron content.

The n+ and p+ layers were deposited utilizing the same procedure as the other samples. The i layer was deposited with the GeH4 amount increased from 0 sccm to 0.35 sccm over 45 minutes and then decreased to 0 sccm over 5 minutes. Deposition of the top buffer layer was followed by an H$_2$ plasma for one minute. BF$_3$ (40 ppm in H$_2$) flow was increased from 0.11 sccm initially to 0.4 sccm at the end of the intrinsic run (51 minutes total). This device exhibited a 9.822% conversion efficiency under AM 1.5 Global illumination with $J_{sc}$=21.041 mA/cm$^2$, $V_{oc}$=0.823 volts FF=0.567 and active area=0.25 cm$^2$, and had the electrical properties as shown in the Table hereinbelow:

TABLE (Sample 2202, Example IX)

| Illumination | AM1.5 | 700 nm | Red = Blue |
|---|---|---|---|
| $J_{sc}$ (mA/cm$^2$) | 20.949 | 11.106 | 2.093, 2.033 |
| $V_{oc}$ (Volts) | 0.818 | 0.785 | 0.717, 0.733 |
| Fill Factor | 0.499 | 0.487 | 0.569, 0.646 |

CONCLUSION

As should be evident following a detailed perusal of the Examples and discussion provided in the subject disclosure, the instant inventors have remodeled conventional intrinsic layer design principles, which principles have guided amorphous silicon solar cell fabricators for the last decade. The instant inventors have destroyed the commonly accepted wisdom that in a multigapped intrinsic layer of amorphous silicon alloy material, it is the narrow band portion thereof which limits the maximum open circuit voltage obtainable from the solar cell; as a matter of fact, and in direct contrast to the foregoing, the instant inventors now believe the open circuit voltage derivable from such a solar cell is limited by the widest band gap portion of the multigapped intrinsic layer thereof. The instant inventors have redesigned the intrinsic layer of silicon alloy material so as to spatially grade the band gap thereof (1) from a narrowmost band gap portion at the light incident thereof to a widest band gap portion interiorly of the thickness thereof; (2) from a widest band gap portion at the light incident surface thereof to a narrowmost band gap portion interiorly of the thickness thereof; (3) in a double profiled manner wherein the narrowmost band gap portion is disposed interiorly of the intrinsic layer with the widest band gap portions disposed at the doped layer interfaces and differing ramping profiles are provided between the widest and narrowmost band gap portions; and (4) for the use of small dopant profiles to aid in charge carrier collection, particularly hole collection. Of course, all of these intrinsic layer designs require optimization in order to be employed with other "tricks of the trade" such as interfacial buffer layers, hydrogen plasmas and textured dual layer back reflectors. It is exciting that despite the complexity of the design considerations and the short time in which work has progressed on these designs, the instant inventors have obtained the highest photoconversion efficiencies ever reported for 1.5 eV band gap amorphous silicon germanium. When optimized for triple stacked solar cell applications, the instant invention is sure to provide world record photoconversion efficiencies for that device structure as well.

Throughout the subject specification, optical band gaps have been quoted, such as 1.5 eV and 1.7 eV. It is to be noted that the band gap of amorphous silicon alloy and amorphous silicon germanium alloy materials are very difficult to measure with precision. While the instant inventors have developed a great deal of expertise in conducting band gap width measurements, those amorphous silicon and silicon germanium alloys which have been quoted as having optical band gaps of approximately 1.5 eV or 1.7 eV may be off by ±0.05 eV. For purposes of the inventive concept disclosed herein, such possible minor error bars in band gap width measurements are insignificant. Moreover, the instant inventors have been careful in ensuring that substantially the same band gap alloy, as measured by germanium incorporation in the deposited alloy, was utilized to obtain the base line cell and the other cells compared thereto.

It must be noted that the inventive concepts disclosed herein, although synergistic, obey all rules of nature. Therefore, these inventive concepts are not limited to multigapped intrinsic layers including band gaps fabricated from amorphous silicon and amorphous silicon germanium alloy materials. Rather, these concepts are also intended to be applied to other multigapped intrinsic layers, which layers include band gaps fabricated from amorphous silicon and amorphous silicon carbon alloy material (which wide band gap cells provide a basis for improving the short circuit current photogenerated in the uppermost cell of a triple stacked photovoltaic device). Computer simulations bear out this extrapolation to intrinsic layers fabricated from a 1.8–2.1eV band gap amorphous silicon carbon alloy material at the p+ interface graded down to a 1.7 eV band gap amorphous silicon alloy material adjacent the n+ interface.

A final feature is worth mentioning. When the boron dopant is introduced into the spatially profiled intrinsic layer of the instant invention so as to improve the collection of holes, great care must be taken to avoid multiple changes in the "sex" of that intrinsic layer. This is because the intrinsic layer is substantially nu-ype (slightly n-type) and the introduction of even small percentages of boron is capable of moving the Fermi level and changing the sex of the layer to pi-type (slightly p-type). Not only could this set up a condition wherein adjacent regions of differing conductivity types in the intrinsic layer would block charge carrier flow, but it could change the major junction in the solar cell structure. This is worth a moment's digression. The major junction in a solar cell occurs at the intrinsic layer/p+ layer interface and not at the intrinsic layer/n+ layer interface. This is because the intrinsic layer is already nu-type and the field is greatest between adjacent regions of greatest field differential. Therefore, if the boron profiling of the intrinsic layer is not carefully controlled, a shift in the sex of the intrinsic layer would result in a shift in the major junction from the intrinsic layer/p+ layer interface to the intrinsic layer/n+ layer interface. If such a shift were to occur, the solar cell structure would require a major modification, including a change in the light incident.

The foregoing description is merely meant to be illustrative of the instant invention, not as a limitation on the practice thereof. Numerous variations and modifications of the disclosed embodiments of the instant invention are possible. It is the following claims, including all equivalents, which are intended to define the scope of the instant invention.

We claim:

1. A solar cell including at least one layer of thin film substantially amorphous intrinsic semiconductor alloy material; said intrinsic layer characterized by at least a first portion of the thickness thereof having a bandgap and a second portion of the thickness thereof having a second bandgap narrower than the first bandgap portion; said intrinsic layer sandwiched between oppositely doped layers of semiconductor alloy material; the bandgap of all portions of the intrinsic layer not contiguous to the intrinsic layer-dopant layer interfaces being less than the bandgap of the dopant layers; the improvement comprising, in combination:

at least one band gap modifying element introduced into at least a substantial portion of the bulk thickness of the intrinsic layer so as to spatially grade the bandgap of said intrinsic layer over a substantial portion of the bulk thickness thereof, said graded portion including a region removed from the intrinsic layer-dopant layer interfaces.

2. A solar cell as in claim 1, wherein germanium is the band gap modifying element and a substantial portion of the bulk of the intrinsic layer is fabricated from a silicon germanium alloy material.

3. A solar cell as in claim 2, wherein the percentage of germanium incorporated into said silicon germanium alloy varies throughout a substantial portion of the bulk thickness of the intrinsic layer.

4. A solar cell as in claim 1, wherein the percentage of germanium incorporated into said silicon germanium alloy is graded through a substantial portion of the bulk thickness of the intrinsic layer.

5. A solar cell as in claim 4, wherein the percentage of germanium incorporated into said intrinsic layer is graded from a minimum adjacent each of the interfaces thereof with the doped layers to a maximum interiorly of the bulk thickness thereof.

6. A solar cell as in claim 5, wherein the grading of said germanium incorporated into said silicon germanium layer is maintained at said maximum for at least 500 angstroms thickness.

7. A solar cell as in claim 5, wherein the grading of said germanium incorporated into said silicon germanium layer reaches a sharp minimum.

8. A solar cell as in claim 5, wherein said intrinsic layer of silicon germanium alloy material includes a substantially germanium-free region at the interfaces thereof with the doped layers.

9. A solar cell as in claim 8, wherein said intrinsic layer further includes a band gap widening element incorporated adjacent the interfaces thereof with said doped layers.

10. A solar cell as in claim 9, wherein said band gap widening element is selected from the group consisting essentially of hydrogen, carbon, nitrogen, and mixtures thereof.

11. A solar cell as in claim 10, wherein the percentage incorporation of the band gap widening element is graded from a maximum at the interfaces of the intrinsic layer with the doped layers to a minimum adjacent to, but interior of, the bulk thickness of the intrinsic layer.

12. A solar cell as in claim 11, wherein the band gap of the intrinsic layer is substantially continuously graded from a widest band gap portion at each of the interfaces thereof with the oppositely disposed doped layers to a minimum bandgap portion adjacent a central region interiorly of the bulk thickness of the intrinsic layer, said central region having a band gap of approximately 1.2–1.6 eV.

13. A solar cell as in claim 4, wherein the band gap of said intrinsic layer of silicon germanium alloy material is graded to about a minimum of 1.2–1.6 eV interiorly of the bulk thickness thereof.

14. A solar cell as in claim 4, wherein the band gap of said intrinsic layer of silicon germanium alloy material is graded to about a minimum of 1.4–1.5 eV interiorly of the bulk thickness thereof.

15. A solar cell as in claim 4, wherein the light incident doped layer is fabricated as a p-type microcrystalline silicon alloy material.

16. A solar cell as in claim 15, wherein said p-type layer further includes a band gap widening element selected from the group consisting essentially of carbon, nitrogen, and combinations thereof.

17. A solar cell as in claim 15, wherein the doped layer opposite said p-type layer is fabricated as an n-type microcrystalline layer of silicon alloy material.

18. A solar cell as in claim 17, wherein said n-type layer further includes a band gap widening element selected from the group consisting essentially of carbon, nitrogen, and combinations thereof.

19. A solar cell as in claim 4, wherein the graded incorporation of germanium into said intrinsic layer is more rapid from the intrinsic layer interface with the light incident doped layer to the region of maximum germanium incorporation interiorly of the bulk thickness thereof as compared to the graded incorporation of germanium from the intrinsic layer interface with the doped layer opposite the light incident doped layer to said region of maximum germanium incorporation.

20. A solar cell as in claim 19, wherein said region of maximum germanium incorporation remains constant for at least 500 angstroms.

21. A solar cell as in claim 4, wherein boron is incorporated into the silicon germanium alloy material of said intrinsic layer so as to improve the collection of photogenerated charge carriers.

22. A solar cell as in claim 21, wherein the boron incorporated into said intrinsic layer is graded to compensate for the graded incorporation of germanium thereinto.

23. A solar cell as in claim 1, further including at least one additional solar cell disposed in optical and electrical series relation to said one solar cell so as to form a tandem photovoltaic structure.

24. A solar cell as in claim 23, wherein at least one of the at least one additional solar cell includes an intrinsic layer of thin film substantially amorphous semiconductor alloy material sandwiched between oppositely doped layers of semiconductor alloy material, said additional intrinsic layer characterized by at least a first portion of the thickness thereof having a band gap and a second portion of the thickness thereof having a band gap narrower than the first band gap; the band gap of the intrinsic layer of said additional cell being spatially graded throughout a substantial portion of the bulk thickness thereof, said graded portion including a region removed from the intrinsic layer-dopant layer interfaces.

25. A solar cell as in claim 24, wherein the narrower band gap semiconductor alloy material of the intrinsic layer of the additional solar cell differs from the narrower band gap semiconductor alloy material of the intrinsic layer of said one solar cell.

26. A solar cell as in claim 25, wherein the band gap and thickness of the intrinsic layers of the one solar cell and the at least one additional solar cell are such that the current photogenerated in each is substantially matched.

27. A solar cell as in claim 26, wherein the light incident doped layer of each cell is fabricated from p-type microcrystalline semiconductor alloy material and the oppositely disposed doped layer of each cell is fabricated from n-type microcrystalline semiconductor alloy material.

28. A solar cell as in claim 27, further including a dual layered back reflector operatively disposed below the lowermost n-type layer; said dual layered back reflector fabricated from a conductive oxide uppermost layer and a highly reflective lowermost layer.

29. A solar cell as in claim 28, wherein the uppermost back reflector layer is fabricated from zinc oxide and the lowermost back reflector layer is fabricated from silver.

30. A solar cell as in claim 28, further including a buffer layer operatively disposed between at least one of the intrinsic layers of semiconductor alloy material and at least one of the light incident doped layers in each of the cells of the photovoltaic structure.

31. A solar cell, including at least one layer of thin film substantially amorphous intrinsic semiconductor alloy material; said intrinsic layer characterized by at least a first portion of the thickness thereof having a bandgap and a second portion of the thickness thereof having a bandgap narrower than the first bandgap portion; said intrinsic layer sandwiched between oppositely doped layers of semiconductor alloy material; the band gap of all portions of the intrinsic layer not contiguous to the intrinsic layer-dopant layer interfaces being less than the band gap of the dopant layers; the improvement comprising, in combination:

at least one band gap modifying element introduced into at least a substantial portion of the bulk thickness of the intrinsic layer so as to spatially grade the band gap of the intrinsic layer from widest band gap portions adjacent each of the interfaces therof with the doped layers to a minimum band gap portion interiorly of the bulk thickness thereof.

32. A solar cell as in claim 31, wherein at least a substantial portion of the bulk of the intrinsic layer is fabricated from a silicon germanium alloy material; the germanium content incorporated into said silicon germanium alloy material is graded throughout a substantial portion of the bulk thickness of the intrinsic layer.

33. A solar cell as in claim 32, wherein the germanium percentage incorporated into said intrinsic layer is graded from a minimum adjacent each of the interfaces thereof with the doped layers to a maximum interiorly of the bulk thickness thereof.

34. A solar cell as in claim 33, wherein said intrinsic layer of silicon germanium alloy material includes a substantially germanium-free region at the interfaces thereof with the doped layers.

35. A solar cell as in claim 34, wherein the light incident doped layer is fabricated from p-type microcrystalline silicon alloy material and said p-type layer includes a band gap widening element selected from the group consisting essentially of carbon, nitrogen, and combinations thereof.

36. A solar cell as in claim 35, wherein the doped layer opposite said p-type layer is fabricated from n-type microcrystalline silicon alloy material and said n-type layer further includes a band gap widening element selected from the group consisting essentially of carbon, nitrogen, and combinations thereof.

37. A solar cell as in claim 33, wherein the graded incorporation of germanium into said intrinsic layer is more rapid from the intrinsic layer interface with the light incident doped layer to the region of maximum germanium incorporation interiorly of the bulk thickness thereof as compared to the graded incorporation of germanium from the intrinsic layer interface with the doped layer opposite the light incident doped layer to said region of maximum germanium incorporation.

38. A solar cell as in claim 37, wherein said region of maximum germanium incorporation is constant for at least 500 angstroms.

39. A solar cell as in claim 33, wherein boron is gradually incorporated into the silicon germanium alloy material of said intrinsic layer so as to improve the collection of photogenerated charge carriers.

40. A solar cell as in claim 33, wherein said intrinsic layer further includes a band gap widening element incorporated adjacent the interfaces thereof with each of said doped layers; said band gap widening element selected from the group consisting essentially of hydrogen, carbon, nitrogen, and mixtures thereof.

41. A solar cell as in claim 40, wherein the bandgap of the intrinsic layer is substantially continuously graded from a widest band gap portion at each of the interfaces thereof with the oppositely disposed doped layers to a minimum band gap portion adjacent a central region interiorly of the bulk thickness of the intrinsic layer.

42. A solar cell as in claim 32, further including at least one additional solar cell disposed in optical and electrical series relation to said one solar cell so as to form a tandem photovoltaic structure.

43. A solar cell as in claim 42, wherein at least one of the at least one additional solar cell includes an intrinsic layer of thin film substantially amorphous semiconductor alloy material sandwiched between oppositely doped layers of semiconductor alloy material, said additional intrinsic layer characterized by at least a first portion of the thickness thereof having a bandgap and a second portion of the thickness thereof having a bandgap narrower than the first band gap; the band gap of the intrinsic layer of said additional cell being spatially graded throughout a substantial portion of the bulk thickness thereof.

44. A solar cell as in claim 43, wherein the narrower band gap semiconductor alloy material of the additional solar cell differs from the narrower band gap semiconductor alloy material of said one solar cell.

45. A solar cell as in claim 44, wherein the band gap and thickness of the intrinsic layers of the one solar cell and the at least one additional solar cell are such that the current photogenerated in each is substantially matched.

* * * * *